(12) United States Patent
Nagasaka

(10) Patent No.: US 8,686,741 B2
(45) Date of Patent: Apr. 1, 2014

(54) EXCESSIVE NOISE RATIO DERIVING DEVICE, NOISE FIGURE DERIVING DEVICE, METHOD, PROGRAM, AND RECORDING MEDIUM

(75) Inventor: Takeshi Nagasaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 571 days.

(21) Appl. No.: 12/994,016

(22) PCT Filed: May 19, 2009

(86) PCT No.: PCT/JP2009/059491
§ 371 (c)(1),
(2), (4) Date: Apr. 8, 2011

(87) PCT Pub. No.: WO2009/145127
PCT Pub. Date: Dec. 3, 2009

(65) Prior Publication Data
US 2011/0178776 A1    Jul. 21, 2011

(30) Foreign Application Priority Data
May 28, 2008   (JP) ................................. 2008-139926

(51) Int. Cl.
G01R 29/26 (2006.01)
G06F 15/00 (2006.01)
(52) U.S. Cl.
USPC .............. 324/614; 324/613; 702/69; 702/190
(58) Field of Classification Search
None
See application file for complete search history.

(56) References Cited

U.S. PATENT DOCUMENTS

| 4,998,071 | A | 3/1991 | Strid et al. | |
|---|---|---|---|---|
| 5,068,615 | A | 11/1991 | Strid et al. | |
| 5,191,294 | A * | 3/1993 | Grace et al. | 324/613 |
| 5,416,422 | A | 5/1995 | Dildine | |
| 6,268,735 | B1 * | 7/2001 | Craig et al. | 324/603 |

(Continued)

FOREIGN PATENT DOCUMENTS

| CN | 1243416 | 2/2006 |
|---|---|---|
| JP | 63-33667 | 2/1988 |

(Continued)

OTHER PUBLICATIONS

Taiwanese Patent Office Search Report, mailed Apr. 26, 2013, in Taiwanese Application No. 098116718.

Primary Examiner — Melissa Koval
Assistant Examiner — Stephen G Armstrong
(74) Attorney, Agent, or Firm — Greenblum & Bernstein, P.L.C.

(57) ABSTRACT

A noise figure deriving device is provided to precisely obtain the noise figure (NF) of a receiver. The noise figure deriving device includes a first NF deriving unit that derives a first noise figure, which is a noise figure when a predetermined receiver-side pin pin1R is connected to a receiver, based on a ratio Y of one power to the other power of two types of reference noise. The noise figure deriving device also includes a second NF deriving unit that derives a second noise figure, which is a noise figure when receiver-side pins pin2R, pin3R, and pin4R are connected to the receiver, based on an inter-measurement-device-side-terminal difference and the first noise figure. The inter-measurement-device-side-terminal difference is a difference between the first noise figure and the second noise figure.

9 Claims, 8 Drawing Sheets

(56) References Cited

U.S. PATENT DOCUMENTS

| | | | |
|---|---|---|---|
| 6,357,029 | B1 | 3/2002 | Sinha et al. |
| 6,775,653 | B1 | 8/2004 | Wei |
| 2004/0039540 | A1 | 2/2004 | Nagasaka |
| 2005/0096859 | A1 | 5/2005 | Torin et al. |
| 2005/0240852 | A1 | 10/2005 | Inaba et al. |
| 2006/0062379 | A1 | 3/2006 | Sedarat et al. |
| 2008/0297172 | A1 * | 12/2008 | Held .............................. 324/614 |

FOREIGN PATENT DOCUMENTS

| | | |
|---|---|---|
| JP | 63-314474 | 12/1988 |
| JP | 2-170060 | 6/1990 |
| JP | 8-75808 | 3/1996 |
| JP | 2005-134398 | 5/2005 |
| JP | 2007-505312 | 3/2007 |
| TW | 484271 | 4/2002 |
| WO | 02/33427 | 4/2002 |
| WO | 2005/052614 | 9/2005 |

* cited by examiner

EXCESSIVE NOISE RATIO DERIVING DEVICE, NOISE FIGURE DERIVING DEVICE, METHOD, PROGRAM, AND RECORDING MEDIUM

TECHNICAL FIELD

The present invention relates to measurement of the excessive noise ratio (ENR) of a noise source, and the noise figure (NF) of a receiver.

BACKGROUND ART

It has conventionally been known to measure the noise figure by connecting a noise source to a device under test (DUT) (refer to Japanese Laid-Open Patent Publication (Kokai) No. H08-75808, for example).

On this occasion, when the DUT is measured while the noise source is connected to the DUT, it is necessary to know, in advance, a precise value of the excessive noise ratio (ENR) of the noise source. Moreover, it is desired to obtain the precise noise figure (NF) of the receiver.

It is therefore an object of the present invention to precisely obtain the value of the excessive noise ratio (ENR) of a noise source.

Moreover, an object of the present invention is to precisely obtain the noise figure (NF) of a receiver.

DISCLOSURE OF THE INVENTION

According to the present invention, an excessive-noise-ratio deriving device which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, includes: a first noise figure deriving unit that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; a second noise figure deriving unit that derives the second noise figure based on the inter-measurement-device-side-terminal difference and the first noise figure; and a noise-source-excessive-noise-ratio deriving unit that derives an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

The thus constructed excessive-noise-ratio deriving device derives an excessive noise ratio when the noise source is connected to each of the plurality of noise-source-side terminals in a transmitter/receiver. The transmitter/receiver includes a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference.

A first noise figure deriving unit derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source. A second noise figure deriving unit derives the second noise figure based on the inter-measurement-device-side-terminal difference and the first noise figure. A noise-source-excessive-noise-ratio deriving unit derives an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

According to the present invention, an excessive-noise-ratio deriving device which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, includes: a first noise figure deriving unit that derives a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source; a first excessive-noise-ratio deriving unit that derives the first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and a second excessive-noise-ratio deriving unit that derives the second excessive noise ratio based on the inter-noise-source-side-terminal difference and the first excessive noise ratio.

Thus constructed excessive-noise-ratio deriving device derives an excessive noise ratio when the noise source is connected to each of the plurality of noise-source-side terminals in a transmitter/receiver. The transmitter/receiver includes a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference.

A first noise figure deriving unit derives a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source. A first excessive-noise-ratio deriving unit derives the first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure. A second excessive-noise-ratio deriving unit derives the second excessive noise ratio based on the inter-noise-source-side-terminal difference and the first excessive noise ratio.

According to the present invention, a noise figure deriving device which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, includes: a first noise figure deriving unit that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and a second noise figure deriving unit that derives the second noise figure based on the inter-measurement-device-side-terminal difference and the first noise figure.

The thus constructed noise figure deriving device derives the first noise figure and the second noise figure in a receiver. The receiver includes a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference.

A first noise figure deriving unit derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source. A second noise figure deriving unit derives the second noise figure based on the inter-measurement-device-side-terminal difference and the first noise figure.

According to the present invention, an excessive-noise-ratio deriving method which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, includes: a first noise figure deriving step that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; a second noise figure deriving step that derives the second noise figure based on the inter-measurement-device-side-terminal difference and the first noise figure; and a noise-source-excessive-noise-ratio deriving step that derives an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

According to the present invention, an excessive-noise-ratio deriving method which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, includes: a first noise figure deriving step that derives a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source; a first excessive-noise-ratio deriving step that derives the first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and a second excessive-noise-ratio deriving step that derives the second excessive noise ratio based on the inter-noise-source-side-terminal difference and the first excessive noise ratio.

According to the present invention, a noise figure deriving method which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, includes: a first noise figure deriving step that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and a second noise figure deriving step that derives the second noise figure based on the inter-measurement-device-side-terminal difference and the first noise figure.

The present invention is a program of instructions for execution by a computer to perform an excessive-noise-ratio deriving process which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, the excessive-noise-ratio deriving process including: a first noise figure deriving step that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; a second noise figure deriving step that derives the second noise figure based on the inter-measurement-device-side-terminal difference and the first noise figure; and a noise-source-excessive-noise-ratio deriving step that derives an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

The present invention is a program of instructions for execution by a computer to perform an excessive-noise-ratio deriving process which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, the excessive-noise-ratio deriving process including: a first noise figure deriving step that derives a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source; a first excessive-noise-ratio deriving step that derives the first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and a second excessive-noise-ratio deriving step that derives the second excessive noise ratio based on the inter-noise-source-side-terminal difference and the first excessive noise ratio.

The present invention is a program of instructions for execution by a computer to perform a noise figure deriving process which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, the noise figure deriving process including: a first noise figure deriving step that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and a second noise figure deriving step that derives the second noise figure based on the inter-measurement-device-side-terminal difference and the first noise figure.

The present invention is a computer-readable medium having a program of instructions for execution by a computer to perform an excessive-noise-ratio deriving process which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, the excessive-noise-ratio deriving process including: a first noise figure deriving step that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; a second noise figure deriving step that derives the second noise figure based on the inter-measurement-device-side-terminal difference and the first noise figure; and a noise-source-excessive-noise-ratio deriving step that derives an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

The present invention is a computer-readable medium having a program of instructions for execution by a computer to perform an excessive-noise-ratio deriving process which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, the excessive-noise-ratio deriving process including: a first noise figure deriving step that derives a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source; a first excessive-noise-ratio deriving step that derives the first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and a second excessive-noise-ratio deriving step that derives the second excessive noise ratio based on the inter-noise-source-side-terminal difference and the first excessive noise ratio.

The present invention is a computer-readable medium having a program of instructions for execution by a computer to perform a noise figure deriving process which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, the noise figure deriving process including: a first noise figure deriving step that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and a second noise figure deriving step that derives the second noise figure based on the inter-measurement-device-side-terminal difference and the first noise figure.

BEST MODE FOR CARRYING OUT THE INVENTION

A description will now be given of embodiments of the present invention referring to drawings.

First Embodiment

A first embodiment of the present invention relates to an excessive-noise-ratio deriving device 50 (refer to FIGS. 3 and 4) which derives excessive noise ratios relating to transmitters/receivers.

Figure 1:
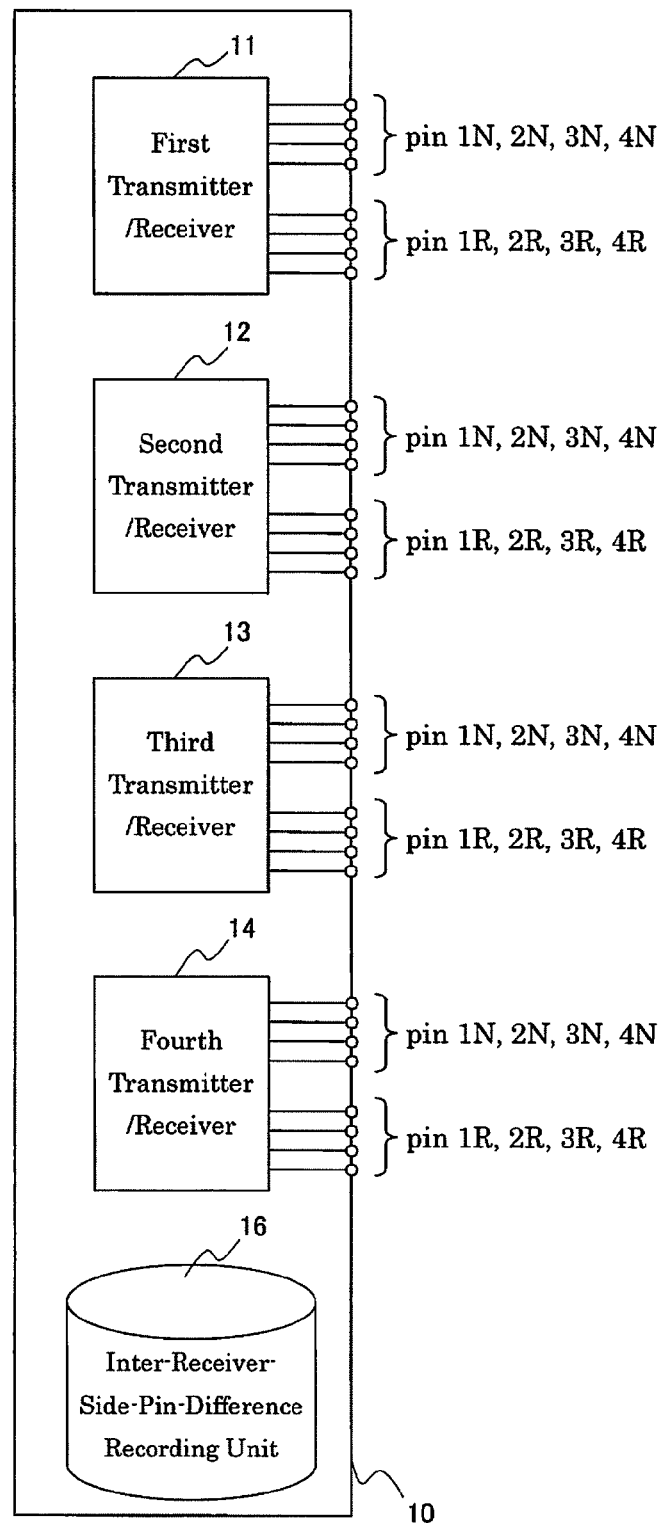
FIG. 1 is a block diagram showing a configuration of an RF module 10 including transmitters/receivers according to the first embodiment of the present invention.

FIG. 1 is a block diagram showing a configuration of an RF module 10 including transmitters/receivers according to the first embodiment of the present invention. The RF module 10 includes a first transmitter/receiver 11, a second transmitter/receiver 12, a third transmitter/receiver 13, a fourth transmitter/receiver 14, and an inter-receiver-side-pin-difference recording unit 16.

The first transmitter/receiver 11 includes noise-source-side pins (noise-source-side terminals) pin1N, pin2N, pin3N, and pin4N, and receiver-side pins (measurement-device-side terminal) pin1R, pin2R, pin3R, and pin4R. The second transmitter/receiver 12, the third transmitter/receiver 13, and the fourth transmitter/receiver 14 similarly include the noise-source-side pins (noise-source-side terminals) pin1N, pin2N, pin3N, pin4N, and the receiver-side pins (measurement-device-side terminal) pin1R, pin2R, pin3R, pin4R.

Figure 2:
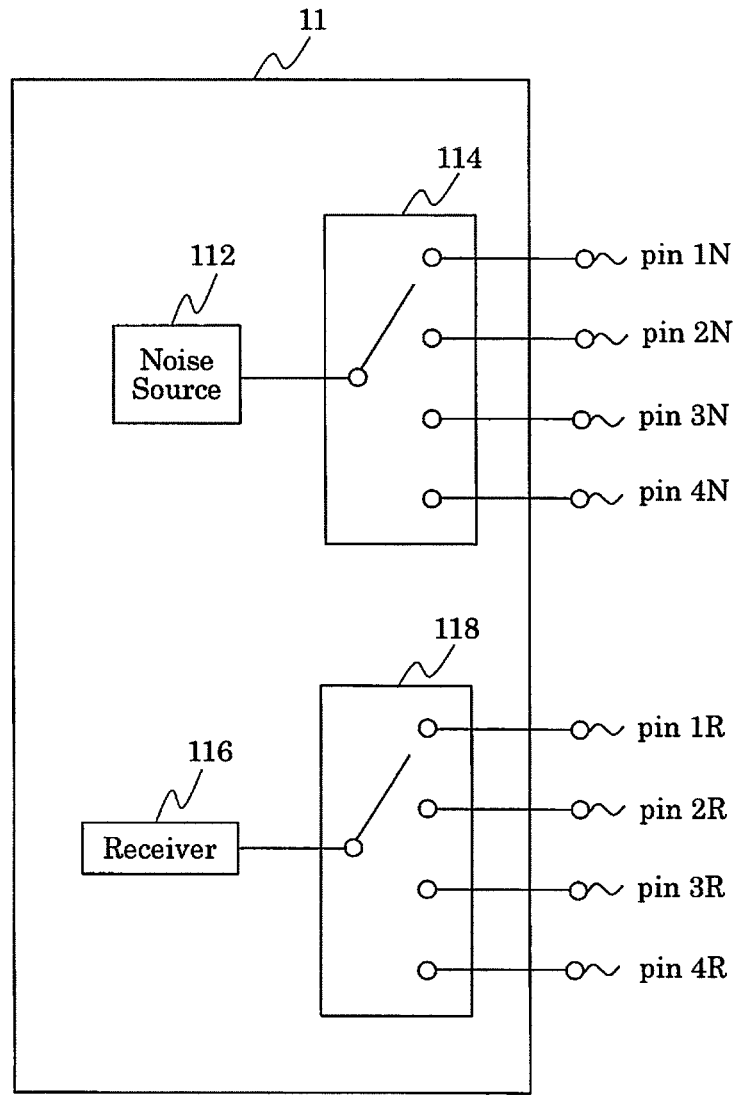
FIG. 2 is a block diagram showing a configuration of the first transmitter/receiver 11.

FIG. 2 is a block diagram showing a configuration of the first transmitter/receiver 11. The first transmitter/receiver 11 includes a noise source 112, a noise-source-side connection device 114, a receiver (power measurement device) 116, and a receiver-side connection device 118.

The noise source 112 outputs two types of noise different in a level from each other. The two types of noise are generally referred to as "hot" and "cold".

The noise-source-side connection device 114 connects the noise source 112 to any one of the multiple noise-source-side pins pin1N, pin2N, pin3N, and pin4N. The noise-source-side connection device 114 is a switch, for example. It is only necessary to connect the noise source 112 to any one of the multiple noise-source-side pins pin1N, pin2N, pin3N, and pin4N according to the first embodiment, and the noise-source-side connection device 114 may not be a switch as long as this configuration is provided.

When the noise source 112 is connected to any one of the multiple noise-source-side pins pin1N, pin2N, pin3N, and pin4N, the connected one noise-source-side pin receives a noise output from the noise source 112. The noise received by the one noise-source-side pin is output to the outside of the first transmitter/receiver 11.

The receiver (power measurement device) 116 measures the power of an input signal input to the receiver 116.

The receiver-side connection device 118 connects the receiver 116 to any one of the multiple receiver-side pins pin1R, pin2R, pin3R, and pin4R. The receiver-side connection device 118 is a switch, for example. It is only necessary to connect the receiver 116 to any one of the multiple receiver-side pins pin1R, pin2R, pin3R, and pin4R according to the first embodiment, and the receiver-side connection device 118 may not be a switch as long as this configuration is provided.

When the receiver-side connection device 118 is connected to any one of the multiple receiver-side pins pin1R, pin2R, pin3R, and pin4R, the input signal is fed via the connected one receiver-side pin to the receiver (power measurement device) 116.

The configurations of the second transmitter/receiver 12, the third transmitter/receiver 13, and the fourth transmitter/receiver 14 are the same as that of the first transmitter/receiver 11, and hence a description thereof is omitted.

On this occasion, the receiver-side pin pin1R, which is one of the receiver-side pins pin1R, pin2R, pin3R, and pin4R, is referred to as predetermined receiver-side pin (predetermined measurement-device-side terminal) pin1R. A noise figure when the predetermined receiver-side pin pin1R is connected to the receiver 116 is referred to as first noise figure. Moreover, a noise figure when one of the receiver-side pins pin2R, pin3R, and pin4R other than the predetermined receiver-side pin pin1R is connected to the receiver 116 is referred to as second noise figure. The noise figure is well-known term, and corresponds to a ratio between an S/N ratio at an input terminal and an S/N ratio at an output terminal.

Moreover, a difference between the first noise figure and the second noise figure is referred to as inter-measurement-device-side-terminal difference. For example, a difference between the first noise figure and a noise figure when the receiver-side pin pin2R is connected to the receiver 116 (second noise figure) is denoted by $\Delta$NF[pin1-2]. For example, a difference between the first noise figure and a noise figure when the receiver-side pin pin3R is connected to the receiver 116 (second noise figure) is denoted by $\Delta$NF[pin1-3]. For example, a difference between the first noise figure and a noise figure when the receiver-side pin pin4R is connected to the receiver 116 (second noise figure) is denoted by $\Delta$NF[pin1-4]. It is assumed that a noise is not added in the receiver-side connection device 118.

Referring to FIG. 1 again, the inter-receiver-side-pin-difference recording unit 16 records the inter-measurement-device-side-terminal differences $\Delta$NF[pin1-2], $\Delta$NF[pin1-3], and $\Delta$NF[pin1-4].

The inter-receiver-side-pin-difference recording unit 16 may not record the inter-measurement-device-side-terminal differences themselves, but may record parameters necessary for obtaining the inter-measurement-device-side-terminal differences. For example, the inter-receiver-side-pin-difference recording unit 16 may record the S parameters of the receiver-side pins pin1R, pin2R, pin3R, and pin4R, and may derive the inter-measurement-device-side-terminal differences from these S parameters.

Figure 3:
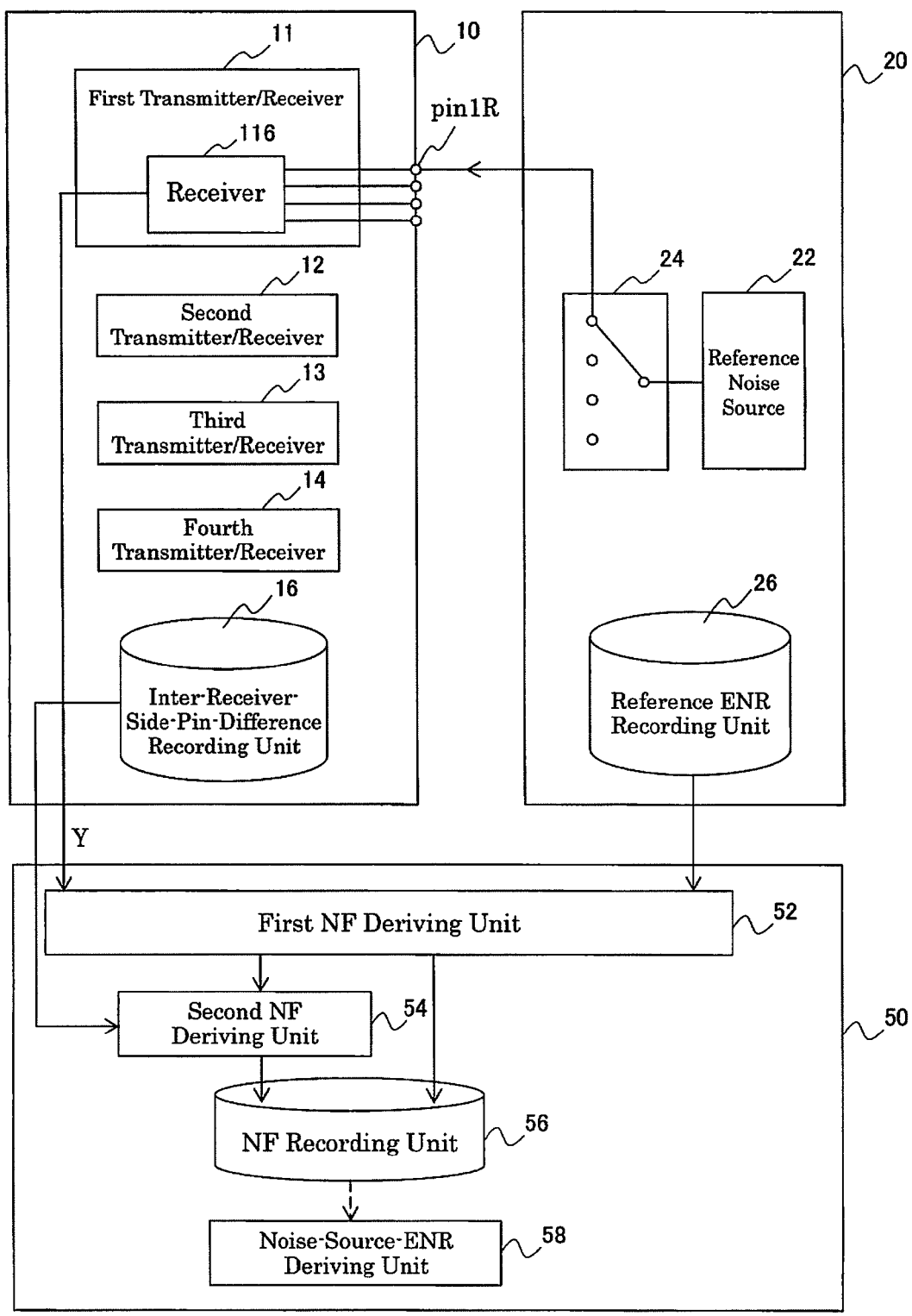
FIG. 3 is a block diagram showing a configuration of the excessive-noise-ratio deriving device 50 according to the first embodiment of the present invention (used along with a first deriving board 20)

FIG. 3 is a block diagram showing a configuration of the excessive-noise-ratio deriving device 50 according to the first embodiment of the present invention (used along with a first deriving board 20). It should be noted that the excessive-noise-ratio deriving device 50 is connected to the first transmitter/receiver 11 of the RF module 10 and the first deriving board 20 in FIG. 3. The noise source 112, the noise-source-side connection device 114, and the receiver-side connection device 118 in the first transmitter/receiver 11 are omitted in FIG. 3. The receiver-side pins and the noise-source-side pins of the second transmitter/receiver 12, the third transmitter/receiver 13, and the fourth transmitter/receiver 14 are omitted in FIG. 3.

The excessive-noise-ratio deriving device 50 derives excessive noise ratios when the noise source 112 is connected respectively to the noise-source-side pins pin1N, pin2N, pin3N, and pin4N.

The first deriving board 20 includes a reference noise source 22, a reference-noise-source-side connection device 24, and a reference ENR recording unit 26.

The reference noise source 22 outputs two types of reference noise different in a level from each other. The two types of reference noise are also generally referred to as "hot" and "cold". It should be noted that the excessive noise ratio of the reference noise source 22 is known. The excessive noise ratio corresponds to a difference in level between "hot" and "cold", and is well-known, and hence a detailed description thereof is omitted. For example, a calibrated noise source is preferably used as the reference noise source 22.

The reference-noise-source-side connection device 24 connects the reference noise source 22 to the receiver-side pin pin1R of any one of the first transmitter/receiver 11, the second transmitter/receiver 12, the third transmitter/receiver 13, and the fourth transmitter/receiver 14. It is assumed that excessive noise ratios are derived when the noise source 112 of the first transmitter/receiver 11 is connected respectively to the noise-source-side pins pin1N, pin2N, pin3N, and pin4N in FIG. 3, and thus the reference noise source 22 is connected to the receiver-side pin pin1R of the first transmitter/receiver 11.

The reference-noise-source-side connection device 24 is a switch, for example. However, it is only necessary to connect the reference noise source 22 to the receiver-side pin pin1R of any one of the first transmitter/receiver 11, the second transmitter/receiver 12, the third transmitter/receiver 13, and the fourth transmitter/receiver 14 according to the first embodiment, and the reference-noise-source-side connection device 24 may not be a switch as long as this configuration is provided.

On this occasion, it is assumed that the receiver-side pin pin1R is connected by the receiver-side connection device 118 to the receiver 116 of the first transmitter/receiver 11. Consequently, the two types of reference noise output from the reference noise source 22 are fed as the input signals via the predetermined receiver-side pin (predetermined measurement-device-side terminal) pin1R to the receiver 116. The receiver 116 measures the powers of the two types of reference noise, and outputs a ratio Y of one to the other of the two types of reference noise (measurement of the power of the hot reference noise/measurement of the power of the cold reference noise).

The reference ENR recording unit 26 records the known excessive noise ratio of the reference noise source 22. The excessive noise ratio of the reference noise source 22 may vary depending on to which of the first transmitter/receiver 11, the second transmitter/receiver 12, the third transmitter/receiver 13, and the fourth transmitter/receiver 14 the reference noise source 22 is connected. Therefore, the known excessive noise ratios of the reference noise source 22 are associated with the first transmitter/receiver 11, the second transmitter/receiver 12, the third transmitter/receiver 13, and the fourth transmitter/receiver 14, and are then recorded.

The excessive-noise-ratio deriving device 50 includes a first NF deriving unit (first noise figure deriving unit) 52, a second NF deriving unit (second noise figure deriving unit) 54, an NF recording unit 56, and a noise-source-ENR deriving unit (noise-source-excessive-noise-ratio deriving unit) 58.

The first NF deriving unit (first noise figure deriving unit) 52 receives the ratio Y output from the receiver 116. The first NF deriving unit 52 further reads the known excessive noise ratio of the reference noise source 22 from the reference ENR recording unit 26. The first NF deriving unit 52 further derives a first noise figure based on the ratio Y output from the receiver 116 and the known excessive noise ratio of the reference noise source 22. If the first noise figure is denoted by NF[pin1R] and the known excessive noise ratio of the reference noise source 22 is denoted by REF_ENR, the first NF deriving unit 52 derives NF[pin1R] according to the following equation (1).

$$NF[pin1R]=REF\_ENR-10\ LOG(Y-1) \quad (1)$$

The second NF deriving unit (second noise figure deriving unit) 54 reads the inter-measurement-device-side-terminal differences $\Delta NF[pin1-2]$, $\Delta NF[pin1-3]$, and $\Delta NF[pin1-4]$ from the inter-receiver-side-pin-difference recording unit 16. The second NF deriving unit 54 further receives the first noise figure NF[pin1R] from the first NF deriving unit 52. The second NF deriving unit (second noise figure deriving unit) 54 further derives second noise figures based on the inter-measurement-device-side-terminal differences and the first noise figure.

On this occasion, out of the second noise figures, a noise figure when the receiver-side pin pin2R is connected to the receiver 116 is denoted by NF[pin2R], a noise figure when the receiver-side pin pin3R is connected to the receiver 116 is denoted by NF[pin3R], and a noise figure when the receiver-side pin pin4R is connected to the receiver 116 is denoted by NF[pin4R]. Then, the second NF deriving unit 54 derives the second noise figures according to the following equations (2), (3), and (4).

$$NF[pin2R]=NF[pin1R]-\Delta NF[pin1-2] \quad (2)$$

$$NF[pin3R]=NF[pin1R]-\Delta NF[pin1-3] \quad (3)$$

$$NF[pin4R]=NF[pin1R]-\Delta NF[pin1-4] \quad (4)$$

The NF recording unit 56 receives the first noise figure from the first NF deriving unit 52, and receives the second noise figures from the second NF deriving unit 54, and records the first noise figure NF[pin1R], and the second noise figures NF[pin2R], NF[pin3R], and NF[pin4R].

Figure 4:
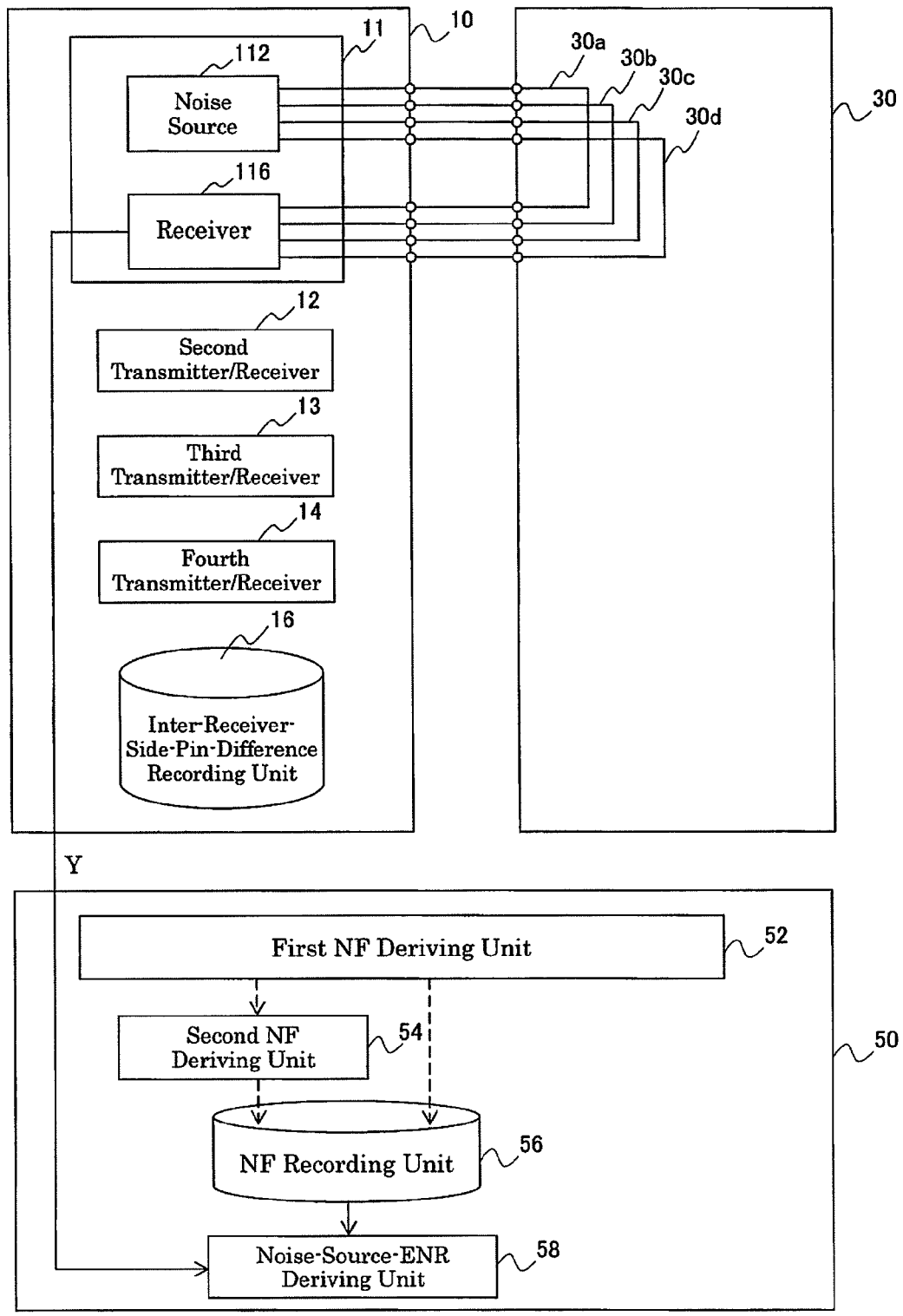
FIG. 4 is a block diagram showing a configuration of the excessive-noise-ratio deriving device 50 according to the first embodiment of the present invention (used along with a second deriving board 30)

FIG. 4 is a block diagram showing a configuration of the excessive-noise-ratio deriving device 50 according to the first embodiment of the present invention (used along with a second deriving board 30). It should be noted that the excessive-noise-ratio deriving device 50 is connected to the first transmitter/receiver 11 of the RF module 10 and the second deriving board 30 in FIG. 4. The noise-source-side connection device 114, and the receiver-side connection device 118 in the first transmitter/receiver 11 are omitted in FIG. 4. The receiver-side pins and the noise-source-side pins of the second transmitter/receiver 12, the third transmitter/receiver 13, and the fourth transmitter/receiver 14 are omitted in FIG. 4.

The second deriving board 30 connects the noise-source-side pins (noise-source-side terminals) pin1N, pin2N, pin3N, and pin4N, and the receiver-side pins (measurement-device-side terminals) pin1R, pin2R, pin3R, and pin4R with each other. Specifically, a connection line 30a connects the noise-source-side pin pin1N and the receiver-side pin pin1R with each other. A connection line 30b connects the noise-source-side pin pin2N and the receiver-side pin pin2R with each other. A connection line 30c connects the noise-source-side pin pin3N and the receiver-side pin pin3R with each other. A connection line 30d connects the noise-source-side pin pin4N and the receiver-side pin pin4R with each other.

On this occasion, it is assumed that the receiver-side connection device 118 connects the receiver-side pin pin1R to the receiver 116 of the first transmitter/receiver 11. Further, the noise-source-side connection device 114 connects the noise-source-side pin pin1N to the noise source 112 of the first transmitter/receiver 11.

Then, the two types of noise output from the noise source 112 are fed as the input signals via the receiver-side pin pin1R to the receiver 116. The receiver 116 measures the powers of the two types of noise, and outputs a ratio Y[pin1R] of one to the other of the two types of noise (measurement of the power of the hot noise/measurement of the power of the cold noise).

Then, the receiver-side connection device 118 connects the receiver-side pin pin2R to the receiver 116 of the first transmitter/receiver 11. Further, the noise-source-side connection device 114 connects the noise-source-side pin pin2N to the noise source 112 of the first transmitter/receiver 11.

Then, the two types of noise output from the noise source 112 are fed as the input signals via the receiver-side pin pin2R to the receiver 116. The receiver 116 measures the powers of the two types of noise, and outputs a ratio Y[pin2R] of one to the other of the two types of noise (measurement of the power of the hot noise/measurement of the power of the cold noise).

Then, the receiver-side connection device 118 connects the receiver-side pin pin3R to the receiver 116 of the first transmitter/receiver 11. Further, the noise-source-side connection device 114 connects the noise-source-side pin pin3N to the noise source 112 of the first transmitter/receiver 11.

Then, the two types of noise output from the noise source 112 are fed as the input signals via the receiver-side pin pin3R to the receiver 116. The receiver 116 measures the powers of the two types of noise, and outputs a ratio Y[pin3R] of one to the other of the two types of noise (measurement of the power of the hot noise/measurement of the power of the cold noise).

Finally, the receiver-side connection device 118 connects the receiver-side pin pin4R to the receiver 116 of the first transmitter/receiver 11. Further, the noise-source-side connection device 114 connects the noise-source-side pin pin4N to the noise source 112 of the first transmitter/receiver 11.

Then, the two types of noise output from the noise source 112 are fed as the input signals via the receiver-side pin pin4R to the receiver 116. The receiver 116 measures the powers of the two types of noise, and outputs a ratio Y[pin4R] of one to the other of the two types of noise (measurement of the power of the hot noise/measurement of the power of the cold noise).

The noise-source-ENR deriving unit (noise-source-excessive-noise-ratio deriving unit) 58 receivers Y[pin1R], Y[pin2R], Y[pin3R], and Y[pin4R] from the receiver 116. The noise-source-ENR deriving unit 58 further reads the first noise figure NF[pin1R] and the second noise figures NF[pin2R], NF[pin3R], and NF[pin4R] from the NF recording unit 56. Based on Y[pin1R], Y[pin2R], Y[pin3R], and Y[pin4R], the first noise figure NF[pin1R], and the second noise figures NF[pin2R], NF[pin3R], and NF[pin4R], the noise-source-ENR deriving unit 58 further derives excessive noise ratios ENR[pin1N], ENR[pin2N], ENR[pin3N], and ENR[pin4N] when the noise source 112 is respectively connected to the noise-source-side pins pin1N, pin2N, pin3N, and pin4N according to the following equations (5)-(8).

$$ENR[pin1N]=NF[pin1R]+10\ LOG(Y[pin1R]-1) \quad (5)$$

$$ENR[pin2N]=NF[pin2R]+10\ LOG(Y[pin2R]-1) \quad (6)$$

$$ENR[pin3N]=NF[pin3R]+10\ LOG(Y[pin3R]-1) \quad (7)$$

$$ENR[pin4N]=NF[pin4R]+10\ LOG(Y[pin4R]-1) \quad (8)$$

A description will now be given of an operation of the first embodiment.

First, referring to FIG. 3, the excessive-noise-ratio deriving device 50 is connected to the first transmitter/receiver 11 of the RF module 10 and the first deriving board 20.

The two types of reference noise output from the reference noise source 22 are fed as the input signals via the predetermined receiver-side pin (predetermined measurement-device-side terminal) pin1R to the receiver 116. The receiver 116 measures the powers of the two types of reference noise, and outputs the ratio Y of one to the other of the two types of reference noise (measurement of the power of the hot reference noise/measurement of the power of the cold reference noise).

The first NF deriving unit (first noise figure deriving unit) 52 receives the ratio Y output from the receiver 116. The first NF deriving unit 52 further reads the known excessive noise ratio REF_ENR of the reference noise source 22 from the reference ENR recording unit 26. The first NF deriving unit 52 derives the first noise figure NF[pin1R] according to the equation (1).

The second NF deriving unit (second noise figure deriving unit) 54 reads the inter-measurement-device-side-terminal differences ΔNF[pin1-2], ΔNF[pin1-3], and ΔNF[pin1-4] from the inter-receiver-side-pin-difference recording unit 16. The second NF deriving unit 54 further receives the first noise figure NF[pin1R] from the first NF deriving unit 52. The second NF deriving unit 54 derives the second noise figures NF[pin2R], NF[pin3R], and NF[pin4R] according to the equations (2), (3), and (4).

The NF recording unit 56 receives the first noise figure NF[pin1R] from the first NF deriving unit 52, the second noise figures NF[pin2R], NF[pin3R], and NF[pin4R] from the second NF deriving unit 54, and records the first noise figure NF[pin1R], and the second noise figures NF[pin2R], NF[pin3R], and NF[pin4R].

Then, referring to FIG. 4, the excessive-noise-ratio deriving device 50 is connected to the first transmitter/receiver 11 of the RF module 10 and the second deriving board 30.

The receiver-side connection device 118 (noise-source-side connection device 114) sequentially connects the receiver-side pins pin1R, pin2R, pin3R, and pin4R (noise-source-side pins pin1N, pin2N, pin3N, and pin4N) to the receiver 116 (noise source 112) of the first transmitter/receiver 11, and the receiver 116 outputs Y[pin1R], Y[pin2R], Y[pin3R], and Y[pin4R].

The noise-source-ENR deriving unit (noise-source-excessive-noise-ratio deriving unit) 58 receives Y[pin1R], Y[pin2R], Y[pin3R], and Y[pin4R] from the receiver 116. The noise-source-ENR deriving unit 58 further reads the first noise figure NF[pin1R] and the second noise figures NF[pin2R], NF[pin3R], and NF[pin4R] from the NF recording unit 56. The noise-source-ENR deriving unit 58 derives the excessive noise ratios ENR[pin1N], ENR[pin2N], ENR[pin3N], and ENR[pin4N] according to the equations (5)-(8).

Operations for deriving the excessive noise ratios of the noise source 112 of the second transmitter/receiver 12, the third transmitter/receiver 13, and the fourth transmitter/receiver 14 are the same as the operation for deriving the excessive noise ratios of the noise source 112 of the first transmitter/receiver 11, and hence a description thereof is omitted.

According to the first embodiment, the first noise figure (noise figure when the predetermined receiver-side pin pin1R is connected to the receiver 116) can be precisely measured by means of the reference noise source 22 the excessive noise ratios of which are known (calibrated noise source, for example).

Moreover, the second noise figures (noise figures when the receiver-side pins pin2R, pin3R, and pin4R other than the predetermined receiver-side pin pin1R are connected to the receiver 116) can be derived without connecting the first deriving board 20 to the receiver-side pins pin2R, pin3R, and pin4R, and a labor required for connection of the RF module 10 to the first deriving board 20 can thus be reduced.

Further, the excessive noise ratios when the noise source 112 is connected respectively to the noise-source-side pins pin1N, pin2N, pin3N, and pin4N of the noise source 112 can be derived based on the first noise figure and the second noise figures. It is not necessary to connect the first deriving board 20 to the receiver-side pins pin2R, pin3R, and pin4R when these excessive noise ratios are derived, and a labor required for connection of the RF module 10 to the first deriving board 20 can thus be reduced.

Second Embodiment

A second embodiment of the present invention relates to the excessive-noise-ratio deriving device 50 (refer to FIGS. 6 and 7) which derives excessive noise ratios relating to transmitters/receivers.

Figure 5:
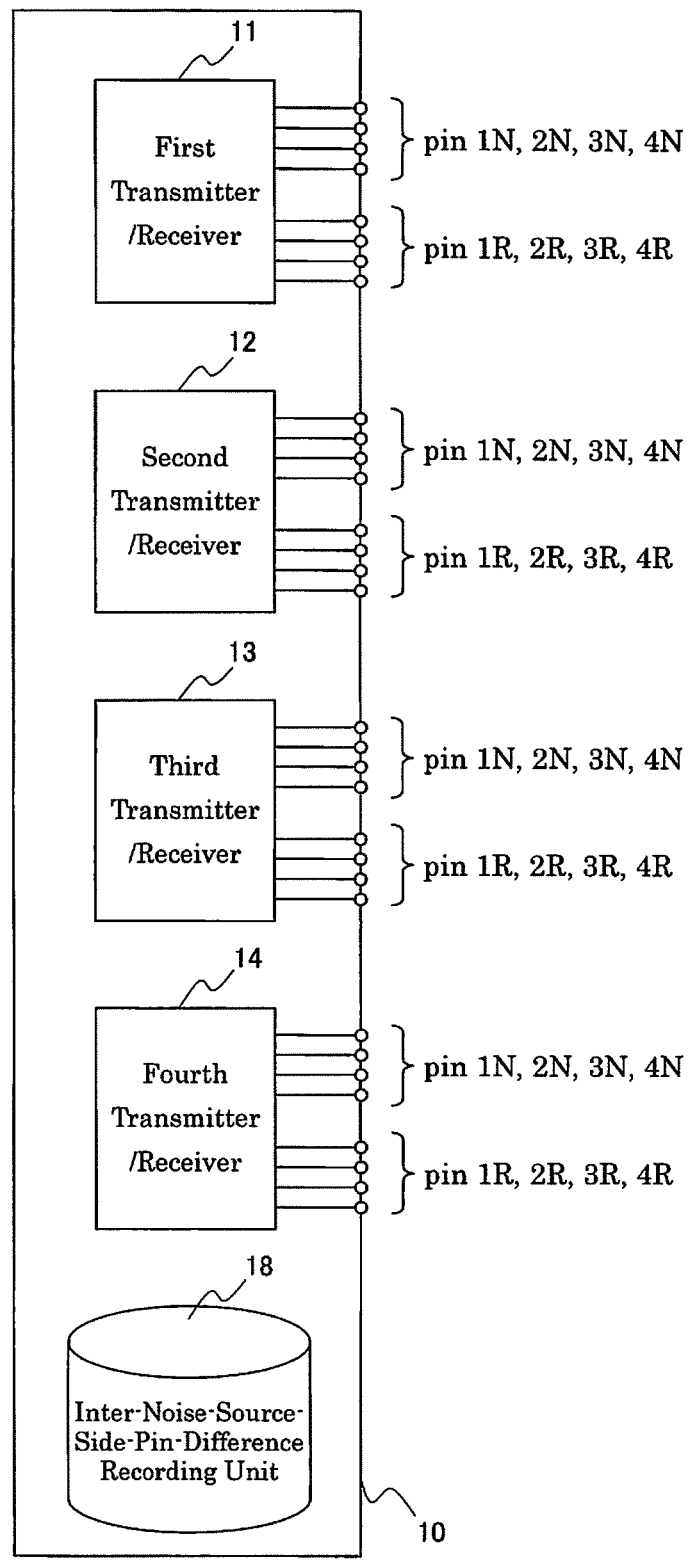
FIG. 5 is a block diagram showing a configuration of the RF module 10 including transmitters/receivers according to the second embodiment of the present invention.

FIG. 5 is a block diagram showing a configuration of the RF module 10 including transmitters/receivers according to the second embodiment of the present invention. The RF module 10 includes the first transmitter/receiver 11, the second transmitter/receiver 12, the third transmitter/receiver 13, the fourth transmitter/receiver 14, and the inter-noise-source-side-pin-difference recording unit 18.

The first transmitter/receiver 11, the second transmitter/receiver 12, the third transmitter/receiver 13, and the fourth transmitter/receiver 14 are the same as those of the first embodiment, and hence description thereof is omitted.

On this occasion, the noise-source-side pin pin1N, which is one of the noise-source-side pins pin1N, pin2N, pin3N, and pin4N, is referred to as predetermined noise-source-side pin (predetermined noise-source-side terminal) pin1N. The excessive noise ratio (ENR) when the predetermined noise-source-side pin pin1N is connected to the noise source 112 is referred to as first excessive noise ratio. Moreover, an excessive noise ratio (ENR) when one of the noise-source-side pins pin2N, pin3N, and pin4N other than the predetermined noise-source-side pin pin1N is connected to the noise source 112 is referred to as second excessive noise ratio.

Further, a difference between the first excessive noise ratio and the second excessive noise ratio is referred to as an inter-noise-source-side-terminal difference. For example, a difference between the first excessive noise ratio and an excessive noise ratio when the noise-source-side pin pin2N is connected to the noise source 112 (second excessive noise ratio) is denoted by $\Delta ENR[pin1\text{-}2]$. For example, a difference between the first excessive noise ratio and an excessive noise ratio when the noise-source-side pin pin3N is connected to the noise source 112 (second excessive noise ratio) is denoted by $\Delta ENR[pin1\text{-}3]$. For example, a difference between the first excessive noise ratio and an excessive noise ratio when the noise-source-side pin pin4N is connected to the noise source 112 (second excessive noise ratio) is denoted by $\Delta ENR[pin1\text{-}4]$.

The inter-noise-source-side-pin-difference recording unit 18 records the inter-noise-source-side-terminal differences $\Delta ENR[pin1\text{-}2]$, $\Delta ENR[pin1\text{-}3]$, and $\Delta ENR[pin1\text{-}4]$.

The inter-noise-source-side-pin-difference recording unit 18 may not record the inter-noise-source-side pin differences themselves, but may record parameters necessary for obtaining the inter-noise-source-side pin differences. For example, the inter-noise-source-side-pin-difference recording unit 18 may record the S parameters of the noise-source-side pins pin1N, pin2N, pin3N, and pin4N, and may derive the inter-noise-source-side pin differences from these S parameters.

Figure 6:
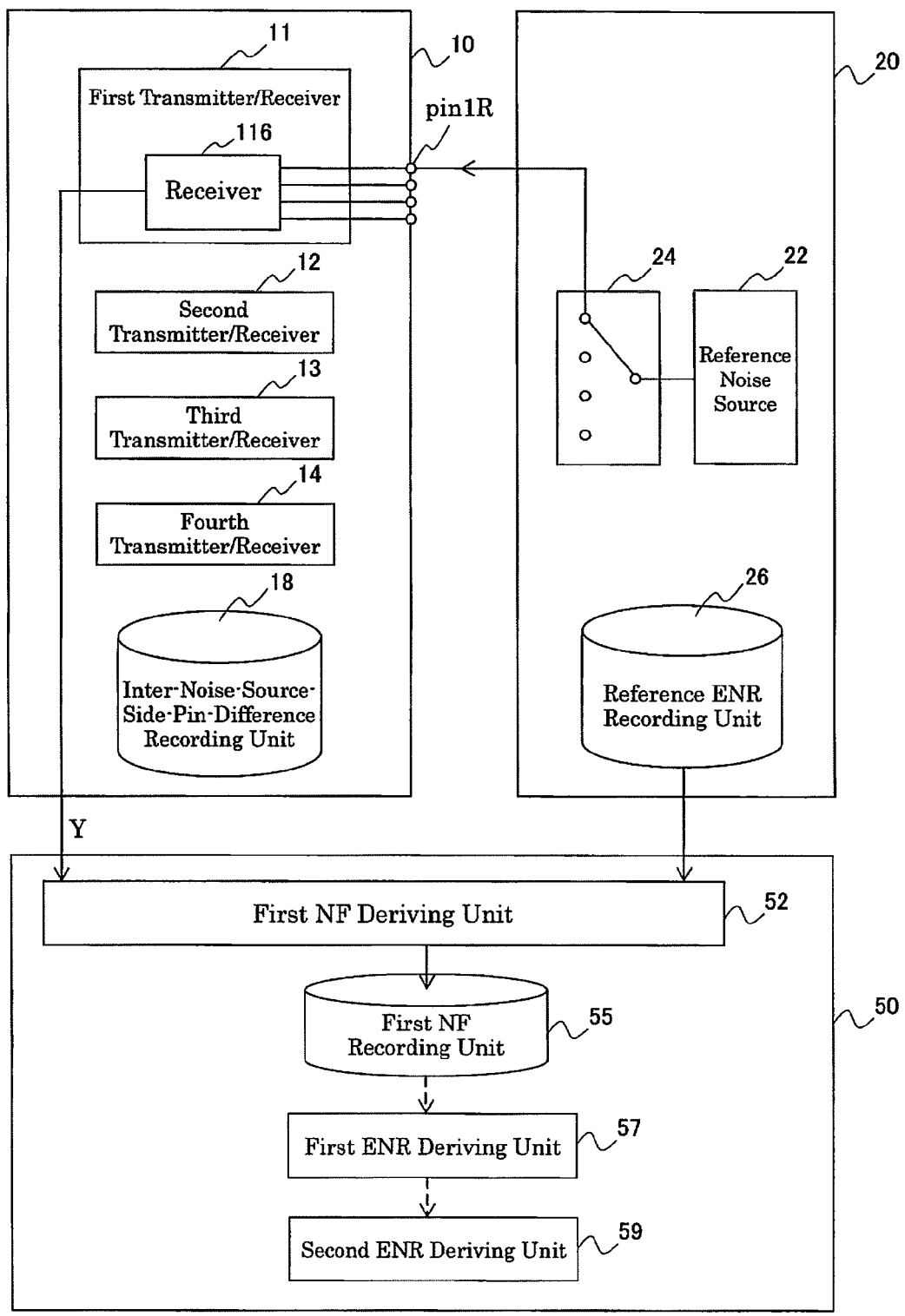
FIG. 6 is a block diagram showing a configuration of the excessive-noise-ratio deriving device 50 according to the second embodiment of the present invention (used along with the first deriving board 20)

FIG. 6 is a block diagram showing a configuration of the excessive-noise-ratio deriving device 50 according to the second embodiment of the present invention (used along with the first deriving board 20). It should be noted that the excessive-noise-ratio deriving device 50 is connected to the first transmitter/receiver 11 of the RF module 10 and the first deriving board 20 in FIG. 6. The noise source 112, the noise-source-side connection device 114, and the receiver-side connection device 118 in the first transmitter/receiver 11 are omitted in FIG. 6. The receiver-side pins and the noise-source-side pins of the second transmitter/receiver 12, the third transmitter/receiver 13, and the fourth transmitter/receiver 14 are omitted in FIG. 6.

The excessive-noise-ratio deriving device 50 derives excessive noise ratios when the noise source 112 is connected respectively to the noise-source-side pins pin1N, pin2N, pin3N, and pin4N.

The first deriving board 20 includes the reference noise source 22, the reference-noise-source-side connection device 24, and the reference ENR recording unit 26. The reference noise source 22, the reference-noise-source-side connection device 24, and the reference ENR recording unit 26 are the same as those of the first embodiment, and hence a description thereof is omitted.

The excessive-noise-ratio deriving device 50 includes the first NF deriving unit (first noise figure deriving unit) 52, a first NF recording unit 55, a first ENR deriving unit (first excessive-noise-ratio deriving unit) 57, and a second ENR deriving unit (second excessive-noise-ratio deriving unit) 59.

The first NF deriving unit (first noise figure deriving unit) 52 is the same as that of the first embodiment, and hence a description thereof is omitted. It should be noted that the receiver-side pin pin1R, which is one of the receiver-side pins pin1R, pin2R, pin3R, and pin4R, is referred to as predetermined receiver-side pin (predetermined measurement-device-side terminal) pin1R, as in the first embodiment.

The first NF recording unit 55 receives the first noise figure from the first NF deriving unit 52, and records the first noise figure.

Figure 7:
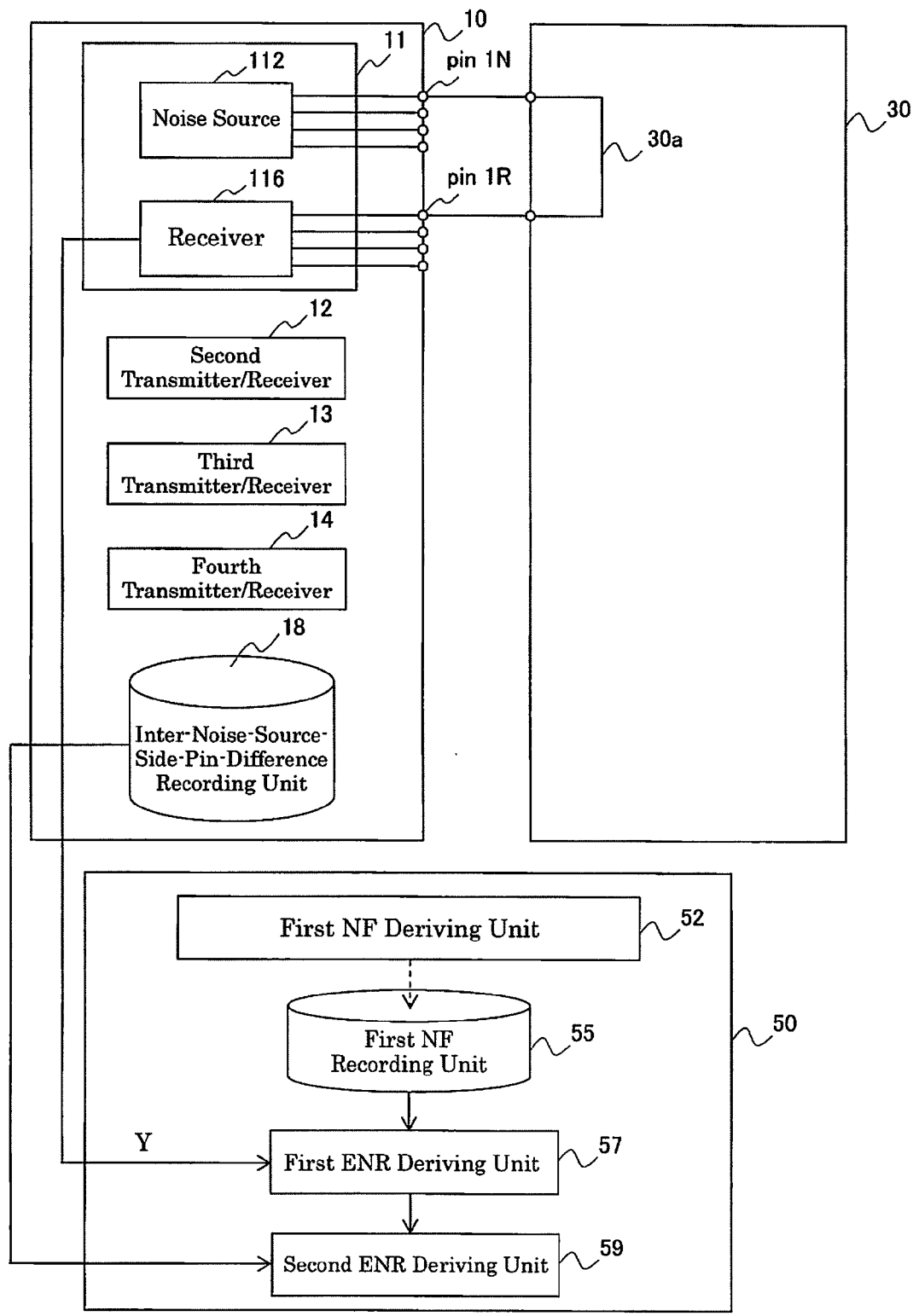
FIG. 7 is a block diagram showing a configuration of the excessive-noise-ratio deriving device 50 according to the second embodiment of the present invention (used along with the second deriving board 30)

FIG. 7 is a block diagram showing a configuration of the excessive-noise-ratio deriving device 50 according to the second embodiment of the present invention (used along with the second deriving board 30). It should be noted that the excessive-noise-ratio deriving device 50 is connected to the first transmitter/receiver 11 of the RF module 10 and the second deriving board 30 in FIG. 7. The noise-source-side connection device 114, and the receiver-side connection device 118 in the first transmitter/receiver 11 are omitted in FIG. 7. The receiver-side pins and the noise-source-side pins of the second transmitter/receiver 12, the third transmitter/receiver 13, and the fourth transmitter/receiver 14 are omitted in FIG. 7.

The second deriving board 30 connects the predetermined receiver-side pin pin1R and the predetermined noise-source-side pin pin1N. Specifically, the connection line 30*a* connects the predetermined noise-source-side pin pin1N and the predetermined receiver-side pin pin1R with each other.

On this occasion, it is assumed that the receiver-side connection device 118 connects the predetermined receiver-side pin pin1R to the receiver 116 of the first transmitter/receiver 11. Further, the noise-source-side connection device 114 connects the predetermined noise-source-side pin pin1N to the noise source 112 of the first transmitter/receiver 11.

Then, the two types of noise output from the noise source 112 are fed as the input signals via the receiver-side pin pin1R to the receiver 116. The receiver 116 measures the powers of the two types of noise, and outputs the ratio Y[pin1R] of one to the other of the two types of noise (measurement of the power of the hot noise/measurement of the power of the cold noise).

The first ENR deriving unit (first excessive-noise-ratio deriving unit) 57 receives Y[pin1R] from the receiver 116. Further, the first ENR deriving unit 57 receives the first noise figure NF[pin1R] from the first NF recording unit 55. The first ENR deriving unit 57 derives the first excessive noise ratio ENR[pin1N] based on Y[pin1R] and the first noise figure NF[pin1R] according to the following equation (9).

$$ENR[pin1N]=NF[pin1R]+10\ LOG(Y[pin1R]-1) \quad (9)$$

The second ENR deriving unit (second excessive-noise-ratio deriving unit) 59 reads the inter-noise-source-side-terminal differences ΔENR[pin1-2], ΔENR[pin1-3], and ΔENR [pin1-4] from the inter-noise-source-side-pin-difference recording unit 18. The second ENR deriving unit 59 further receives the first excessive noise ratio ENR[pin1N] from the first ENR deriving unit 57. The second ENR deriving unit 59 further derives the second excessive noise ratio based on the inter-noise-source-side-terminal difference and the first excessive noise ratio.

On this occasion, out of the second excessive noise ratio, an excessive noise ratio when the noise-source-side pin pin2N is connected to the noise source 112 is denoted by ENR[pin2N], an excessive noise ratio when the noise-source-side pin pin3N is connected to the noise source 112 is denoted by ENR[pin3N], and an excessive noise ratio when the noise-source-side pin pin4N is connected to the noise source 112 is denoted by ENR[pin4N]. Then, the second ENR deriving unit 59 derives the second excessive noise ratios according to the following equations (10), (11), and (12).

$$ENR[pin2N]=ENR[pin1N]-\Delta ENR[pin1-2] \quad (10)$$

$$ENR[pin3N]=ENR[pin1N]-\Delta ENR[pin1-3] \quad (11)$$

$$ENR[pin4N]=ENR[pin1N]-\Delta ENR[pin1-4] \quad (12)$$

A description will now be given of an operation of the second embodiment.

First, referring to FIG. 6, the excessive-noise-ratio deriving device 50 is connected to the first transmitter/receiver 11 of the RF module 10 and the first deriving board 20.

The two types of reference noise output from the reference noise source 22 are fed as the input signals via the predetermined receiver-side pin (predetermined measurement-device-side terminal) pin1R to the receiver 116. The receiver 116 measures the powers of the two types of reference noise, and outputs the ratio Y of one to the other of the two types of reference noise (measurement of the power of the hot reference noise/measurement of the power of the cold reference noise).

The first NF deriving unit (first noise figure deriving unit) 52 receives the ratio Y output from the receiver 116. The first NF deriving unit 52 further reads the known excessive noise ratio REF_ENR of the reference noise source 22 from the reference ENR recording unit 26. The first NF deriving unit 52 derives the first noise figure NF[pin1R] according to the equation (1). The first noise figure NF[pin1R] is recorded in the first NF recording unit 55.

Then, referring to FIG. 7, the excessive-noise-ratio deriving device 50 is connected to the first transmitter/receiver 11 of the RF module 10 and the second deriving board 30.

The receiver-side connection device 118 (noise-source-side connection device 114) connects the predetermined receiver-side pin pin1R (predetermined noise-source-side pin pin1N) to the receiver 116 (noise source 112) of the first transmitter/receiver 11, and the receiver 116 outputs Y[pin1R].

The first ENR deriving unit (first excessive-noise-ratio deriving unit) 57 receives Y[pin1R] from the receiver 116. The first ENR deriving unit 57 further reads the first noise figure NF[pin1R] from the first NF recording unit 55. The first ENR deriving unit 57 derives the first excessive noise ratio ENR[pin1N] according to the equation (9).

The second ENR deriving unit (second excessive-noise-ratio deriving unit) 59 reads the inter-noise-source-side-terminal differences ΔENR[pin1-2], ΔENR[pin1-3], and ΔENR [pin1-4] from the inter-noise-source-side-pin-difference recording unit 18. The second ENR deriving unit 59 further reads the first excessive noise ratio ENR[pin1N] from the first ENR deriving unit 57. The second ENR deriving unit 59 derives the second excessive noise ratios ENR[pin2N], ENR [pin3N], and ENR[pin4N] according to the equations (10), (11), and (12).

Operations of the second transmitter/receiver 12, the third transmitter/receiver 13, and the fourth transmitter/receiver 14 for deriving the excessive noise ratios of the noise source 112 are the same as the operation of the first transmitter/receiver 11 for deriving the excessive noise ratios, and hence a description thereof is omitted.

According to the second embodiment, the first noise figure (noise figure when the predetermined receiver-side pin pin1R is connected to the receiver 116) can be precisely measured by means of the reference noise source 22 the excessive noise ratios of which are known (calibrated noise source, for example).

Further, the excessive noise ratios when the noise source 112 is connected respectively to the noise-source-side pins pin1N, pin2N, pin3N, and pin4N can be derived based on the first noise figure. It is not necessary to connect the first deriving board 20 to the receiver-side pins pin2R, pin3R, and pin4R when these excessive noise ratios are derived, and to connect the second deriving board 30 to the noise-source-side pins pin2N, pin3N, and pin4N, and a labor required for connection of the RF module 10 to the first deriving board 20 and the second deriving board 30 can thus be reduced.

Third Embodiment

A third embodiment of the present invention relates to a noise figure deriving device 60 (refer to FIG. 8) which derives noise figures relating to transmitters/receivers (considered as receivers).

Figure 8:
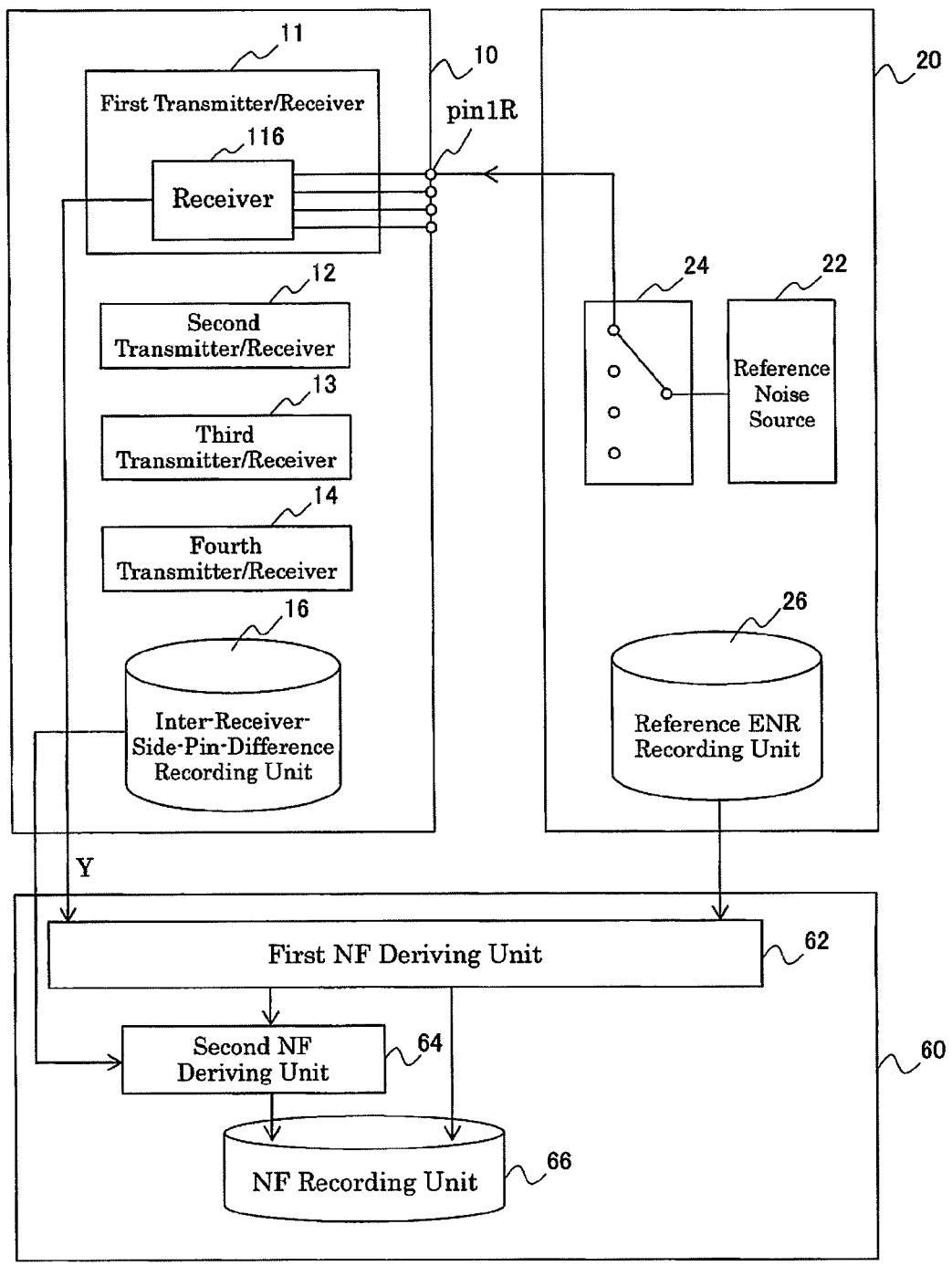
FIG. 8 is a block diagram showing a configuration of the noise figure deriving device 60 according to the third embodiment of the present invention.

FIG. 8 is a block diagram showing a configuration of the noise figure deriving device 60 according to the third embodiment of the present invention. It should be noted that the noise figure deriving device 60 is connected to the first transmitter/receiver 11 of the RF module 10 and the first deriving board 20 in FIG. 8. The noise source 112, the noise-source-side connection device 114, and the receiver-side connection device 118 in the first transmitter/receiver 11 are omitted in FIG. 8. The receiver-side pins and the noise-source-side pins of the second transmitter/receiver 12, the third transmitter/receiver 13, and the fourth transmitter/receiver 14 are omitted in FIG. 8.

The RF module 10 and the first deriving board 20 are the same as those in the first embodiment, and a description thereof, therefore, is omitted.

The noise figure deriving device 60 includes a first NF deriving unit (first noise figure deriving unit) 62, a second NF deriving unit (second noise figure deriving unit) 64, and an NF recording unit 66.

The noise figure deriving unit 60 derives noise figures when the receiver 116 is connected respectively to the receiver-side pins pin1R, pin2R, pin3R, and pin4R.

The first NF deriving unit (first noise figure deriving unit) 62 is the same as the first NF deriving unit (first noise figure deriving unit) 52 of the first embodiment, and hence a description thereof is omitted.

The second NF deriving unit (second noise figure deriving unit) 64 is the same as the second NF deriving unit (second noise figure deriving unit) 54 of the first embodiment, and hence a description thereof is omitted.

The NF recording unit 66 is the same as the NF recording unit 56 of the first embodiment, and hence a description thereof is omitted.

A description will now be given of an operation of the third embodiment.

First, referring to FIG. 8, the noise figure deriving device 60 is connected to the first transmitter/receiver 11 of the RF module 10 and the first deriving board 20.

The two types of reference noise output from the reference noise source 22 are fed as the input signals via the predetermined receiver-side pin (predetermined measurement-device-side terminal) pin1R to the receiver 116. The receiver 116 measures the powers of the two types of reference noise, and outputs the ratio Y of one to the other of the two types of reference noise (measurement of the power of the hot reference noise/measurement of the power of the cold reference noise).

The first NF deriving unit (first noise figure deriving unit) 62 receives the ratio Y output from the receiver 116. The first NF deriving unit 62 further reads the known excessive noise ratio REF_ENR of the reference noise source 22 from the reference ENR recording unit 26. The first NF deriving unit 62 derives the first noise figure NF[pin1R] according to the equation (1).

The second NF deriving unit (second noise figure deriving unit) 64 reads the inter-measurement-device-side-terminal differences ΔNF[pin1-2], ΔNF[pin1-3], and ΔNF[pin1-4] from the inter-receiver-side-pin-difference recording unit 16. The second NF deriving unit 64 further receives the first noise figure NF[pin1R] from the first NF deriving unit 62. The second NF deriving unit 64 derives the second noise figures NF[pin2R], NF[pin3R], and NF[pin4R] according to the equations (2), (3), and (4).

The NF recording unit 66 receives the first noise figure NF[pin1R] from the first NF deriving unit 62, the second noise figures NF[pin2R], NF[pin3R], and NF[pin4R] from the second NF deriving unit 64, and records the first noise figure NF[pin1R], and the second noise figures NF[pin2R], NF[pin3R], and NF[pin4R].

According to the third embodiment, the first noise figure (noise figure when the predetermined receiver-side pin pin1R is connected to the receiver 116) can be precisely measured by means of the reference noise source 22 the excessive noise ratios of which are known (calibrated noise source, for example).

Moreover, the second noise figures (noise figures when the receiver-side pins pin2R, pin3R, and pin4R other than the predetermined receiver-side pin pin1R are connected to the receiver 116) can be derived without connecting the first deriving board 20 to the receiver-side pins pin2R, pin3R, and pin4R, and a labor required for connection of the RF module 10 to the first deriving board 20 can thus be reduced.

Moreover, the above-described embodiments may be realized in the following manner. A computer is provided with a CPU, a hard disk, and a media (such as a floppy disk (registered trade mark) and a CD-ROM) reader, and the media reader is caused to read a medium recording a program realizing the above-described respective components such as the excessive-noise-ratio deriving device 50 and the noise figure deriving device 60, thereby installing the program on the hard disk. This method may also realize the above-described functions.

The invention claimed is:

1. An excessive-noise-ratio deriving device which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, comprising:

a first noise figure deriving unit that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source;

a second noise figure deriving unit that derives the second noise figure based on the inter-measurement-device-side-terminal difference and the first noise figure; and a noise-source-excessive-noise-ratio deriving unit that derives an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

2. An excessive-noise-ratio deriving device which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, comprising:

a first noise figure deriving unit that derives a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source;

a first excessive-noise-ratio deriving unit that derives the first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and a second excessive-noise-ratio deriving unit that derives the second excessive noise ratio based on the inter-noise-source-side-terminal difference and the first excessive noise ratio.

3. A noise figure deriving device which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, comprising:

a first noise figure deriving unit that derives the first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and a second noise figure deriving unit that derives the second noise figure based on the inter-measurement-device-side-terminal difference and the first noise figure.

4. An excessive-noise-ratio deriving method which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, comprising:

deriving a first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source;

deriving a second noise figure based on the inter-measurement-device-side-terminal difference and the first noise figure; and deriving an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

5. An excessive-noise-ratio deriving method which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, comprising:

deriving a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source;

deriving a first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and deriving a second excessive noise ratio based on the inter-noise-source-side-terminal difference and the first excessive noise ratio.

6. A noise figure deriving method which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, comprising:

deriving a first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and deriving a second noise figure based on the inter-measurement-device-side-terminal difference and the first noise figure.

7. A non-transitory computer-readable medium having a program of instructions for execution by a computer to perform an excessive-noise-ratio deriving process which, in a transmitter/receiver including a noise source which outputs two types of noise different in a level from each other, a plurality of noise-source-side terminals, a power measurement device which measures a power of an input signal, and a plurality of measurement-device-side terminals, wherein one of the plurality of noise-source-side terminals receives the noise output from the noise source, the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives an excessive noise ratio when the noise source is connected to each of the plurality of noise-source-side terminals, the excessive-noise-ratio deriving process comprising:

deriving a first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source;

deriving a second noise figure based on the inter-measurement-device-side-terminal difference and the first noise figure; and deriving an excessive noise ratio when the noise source is connected to each of the plurality of noise-source-side terminals based on a ratio of one power to the other power of the two types of noise measured by the power measurement device when each of the plurality of noise-source-side terminals and each of the measurement-device-side terminals are connected to each other, and the two types of noise output from the noise source are fed as the input signals to the power measurement device, the first noise figure, and the second noise figure.

8. A non-transitory computer-readable medium having a program of instructions for execution by a computer to perform an excessive-noise-ratio deriving process which, in a transmitter/receiver including a noise source which outputs two types of noise different in a level from each other, a plurality of noise-source-side terminals, a power measurement device which measures a power of an input signal, and at least one measurement-device-side terminal, wherein one of the plurality of noise-source-side terminals receives the noise output from the noise source, the input signal is fed via a predetermined measurement-device-side terminal, which is one of the at least one measurement-device-side terminals, to the power measurement device, and a difference between a first excessive noise ratio which is an excessive noise ratio when a predetermined noise-source-side terminal, which is one of the plurality of noise-source-side terminals, is connected to the noise source and a second excessive noise ratio which is an excessive noise ratio when a noise-source-side terminal which is one of the plurality of noise-source-side terminals, and is other than the predetermined noise-source-side terminal, is connected to the noise source, is designated as inter-noise-source-side-terminal difference, derives an excessive noise ratio when the noise source is connected to each of the plurality of noise-source-side terminals, the excessive-noise-ratio deriving process comprising:

deriving a first noise figure, which is a noise figure when the predetermined measurement-device-side terminal is connected to the power measurement device, based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device and the excessive noise ratio of the reference noise source;

deriving a first excessive noise ratio based on a ratio of one power to the other power of two types of noise measured by the power measurement device when the predetermined noise-source-side terminal and the predetermined measurement-device-side terminal are connected to each other, and the two types of noise output from the noise source are fed as the input signals to the power measurement device, and the first noise figure; and deriving a second excessive noise ratio based on the inter-noise-source-side-terminal difference and the first excessive noise ratio.

9. A non-transitory computer-readable medium having a program of instructions for execution by a computer to perform a noise figure deriving process which, in a receiver including a power measurement device which measures a power of an input signal, and a plurality of measurement-device-side terminals, wherein the input signal is fed via any one of the plurality of the measurement-device-side terminals to the power measurement device, and a difference between a first noise figure which is a noise figure when a predetermined measurement-device-side terminal, which is one of the plurality of measurement-device-side terminals, is connected to the power measurement device and a second noise figure which is a noise figure when a measurement-device-side terminal, which is one of the plurality of measurement-device-side terminals, and is other than the predetermined measurement-device-side terminal, is connected to the power measurement device is designated as inter-measurement-device-side-terminal difference, derives the first noise figure and the second noise figure, the noise figure deriving process comprising:

deriving a first noise figure based on a ratio of one power to the other power of two types of reference noise, which are different from each other in a level, are output from a reference noise source an excessive noise ratio of which is known, and are measured by the power measurement device when the two types of reference noise are fed as the input signals via the predetermined measurement-device-side terminal to the power measurement device, and the excessive noise ratio of the reference noise source; and deriving a second noise figure based on the inter-measurement-device-side-terminal difference and the first noise figure.

* * * * *